(12) United States Patent
Takei et al.

(10) Patent No.: US 8,207,046 B2
(45) Date of Patent: Jun. 26, 2012

(54) METHOD FOR PRODUCING SEMICONDUCTOR DEVICE AND SEMICONDUCTOR DEVICE PRODUCED BY SAME METHOD

(75) Inventors: Michiko Takei, Osaka (JP); Shin Matsumoto, Osaka (JP); Yasumori Fukushima, Osaka (JP); Yutaka Takafuji, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 229 days.

(21) Appl. No.: 12/682,221

(22) PCT Filed: Oct. 21, 2008

(86) PCT No.: PCT/JP2008/069017
§ 371 (c)(1),
(2), (4) Date: Apr. 8, 2010

(87) PCT Pub. No.: WO2009/084309
PCT Pub. Date: Jul. 9, 2009

(65) Prior Publication Data
US 2010/0207212 A1    Aug. 19, 2010

(30) Foreign Application Priority Data
Dec. 27, 2007  (JP) ................................ 2007-338328

(51) Int. Cl.
*H01L 21/02* (2006.01)
(52) U.S. Cl. ........ 438/455; 438/458; 438/459; 438/475; 438/507; 438/526; 257/E21.088; 257/E21.122; 257/E21.143; 257/E21.567; 257/E21.568
(58) Field of Classification Search .......... 438/455–459, 438/475, 507, 526, 960; 257/E21.088, 121, 257/122, 143, 215, 319, 335, 567–569, 601, 29.002
See application file for complete search history.

(56) References Cited

U.S. PATENT DOCUMENTS

| | | | | |
|---|---|---|---|---|
| 5,466,631 A | * | 11/1995 | Ichikawa et al. | 438/406 |
| 5,869,387 A | * | 2/1999 | Sato et al. | 438/459 |
| 6,146,979 A | * | 11/2000 | Henley et al. | 438/458 |
| 6,159,824 A | * | 12/2000 | Henley et al. | 438/455 |
| 6,558,802 B1 | * | 5/2003 | Henley et al. | 428/446 |

(Continued)

FOREIGN PATENT DOCUMENTS
JP   2004-134675 A   4/2004
(Continued)

OTHER PUBLICATIONS

U.S. Office Action dated Jan. 24, 2012 issued in co-pending U.S. Appl. No. 12/674,560.

(Continued)

*Primary Examiner* — Michael Lebentritt
(74) *Attorney, Agent, or Firm* — Birch, Stewart, Kolasch & Birch LLP

(57) ABSTRACT

To prevent bubbles from occurring along a transfer interface, the present method includes the steps of: forming a peeled layer 10 in a transferred member 6 by implanting a peeled-layer forming substance into the transferred member 6; forming a planar surface in the transferred member 6 by planarizing a surface of the transferred member 6; forming a composite including the transferred member 6 and a glass substrate 2 by directly combining the transferred member 6 via the planar surface with a surface of the glass substrate 2; and peeling a part of the transferred member 6 from the composite along the peeled layer 10 serving as an interface by heat-treating the composite.

40 Claims, 8 Drawing Sheets

U.S. PATENT DOCUMENTS

| | | | |
|---|---|---|---|
| 6,602,767 B2 * | 8/2003 | Nishida et al. | 438/507 |
| 6,890,838 B2 * | 5/2005 | Henley et al. | 438/475 |
| 2001/0041423 A1 * | 11/2001 | Nishida et al. | 438/455 |
| 2004/0061176 A1 | 4/2004 | Takafuji et al. | |
| 2004/0171232 A1 * | 9/2004 | Cayrefourcq et al. | 438/458 |
| 2005/0074954 A1 * | 4/2005 | Yamanaka | 438/458 |
| 2005/0282019 A1 * | 12/2005 | Fukushima et al. | 428/428 |
| 2005/0282306 A1 * | 12/2005 | Yamanaka | 438/57 |
| 2006/0057820 A1 * | 3/2006 | Yamanaka | 438/458 |
| 2007/0277875 A1 * | 12/2007 | Gadkaree et al. | 136/256 |
| 2008/0070340 A1 * | 3/2008 | Borrelli et al. | 438/57 |
| 2008/0305317 A1 | 12/2008 | Ito et al. | |
| 2009/0061593 A1 * | 3/2009 | Gadkaree et al. | 438/458 |
| 2009/0095956 A1 | 4/2009 | Takafuji et al. | |
| 2009/0170298 A1 * | 7/2009 | Brailove | 438/532 |
| 2009/0191667 A1 * | 7/2009 | Higashino et al. | 438/109 |
| 2012/0001293 A1 * | 1/2012 | Ben Mohamed et al. | 257/506 |

FOREIGN PATENT DOCUMENTS

| | | |
|---|---|---|
| JP | 2006-5245 A | 1/2006 |
| JP | 2006-210898 A | 8/2006 |
| JP | 2006-344666 A | 12/2006 |

OTHER PUBLICATIONS

Ohmi, "Ultraclean ULSI Technology", Baifukan, p. 172.

S.S.Iyer et al., "Silicon Wafer Bonding Technology for VLSI and MEMS applications", 2002, pp. 36-43.

Office Action dated Oct. 13, 2011 for U.S. Appl. No. 12/674,560.

\* cited by examiner

POLY-Si TFT FORMED ON GLASS SUBSTRATE

DESORBED H$_2$O (m/e=18) SPECTRA

DESORBED $H_2$ (m/e=2) SPECTRA

METHOD FOR PRODUCING SEMICONDUCTOR DEVICE AND SEMICONDUCTOR DEVICE PRODUCED BY SAME METHOD

TECHNICAL FIELD

The present invention relates to a method for producing a semiconductor device and to a semiconductor device produced by this method. The present invention particularly relates to (i) a method for forming, e.g., a single-crystal silicon film on a substrate such as a glass substrate by transferring, onto the substrate, a single-crystal chip of a semiconductor such as silicon, a semiconductor chip, and/or a semiconductor device, and to (ii) various devices produced by the method.

BACKGROUND ART

Conventionally, the following techniques (i) and (ii) have been proposed, and have greatly advanced interdependently on at least growth in use of liquid crystal displays: (i) an integrated circuit element technique in which a single-crystal silicon substrate is processed so that approximately hundreds of millions of transistors are formed on the single-crystal silicon substrate; and (ii) a thin film transistor (TFT) technique in which a polycrystalline semiconductor film such as a silicon film is formed on a light-transmitting amorphous substrate such as a glass substrate, and is then transformed into transistors so as to be prepared as semiconductor elements, for use in a liquid crystal display device, such as picture elements, switching elements, and drivers.

Of the techniques (i) and (ii), according to the integrated circuit element technique (i), for example, a commercially available single-crystal silicon wafer having a thickness of at most 1 mm and having a diameter of approximately 200 mm is processed so that a large number of transistors are formed on the silicon wafer.

In contrast, according to the thin film transistor technique (ii), in a case where it is employed in a TFT liquid crystal display device, for example, an amorphous silicon film formed on an alkali-free glass substrate having a light-transmitting property (i.e., having an amorphous; having a high strain point) is melted and polycrystallized by heating such as the laser heating, and is then transformed into MOS transistors serving as switching elements.

Another technique has been proposed in which a silicon thin film, in particular a single-crystal silicon thin film, is formed on an insulator by a transfer method. Actually, various substrates are produced by the transfer method.

In a field of integrated circuits, a substrate is employed so as to improve a function of a semiconductor element such as a transistor.

Specifically, in a case where a transistor is prepared with the use of a substrate, the transistor (element) is completely separated from other components. This causes a reduction in constraints on the operation of the transistor. Consequently, the transistor exhibits good properties and high performance.

Note here that the substrate employed in the field of integrated circuits is simply required to be an insulator (or an insulating film). It will not matter whether or not the substrate is light transparent and it will not matter whether or not the substrate is a crystalline material.

In contrast, in a field of display devices such as a TFT liquid crystal display (LCD) device and a TFT organic electroluminescence (organic light emitting diode; OLED) display device, a substrate is required to be transparent. Hence, an amorphous substrate such as a glass plate is normally used as the substrate.

After a thin film such as an amorphous silicon film or a polysilicon film is formed on such a transparent substrate, TFTs are prepared by use of the amorphous silicon film or the polysilicon film. Such TFTs can function as switching elements for carrying out so-called active matrix driving with respect to the display device.

In order for circuits for the active matrix driving such as peripheral drivers and timing controllers are integrated on a substrate, research has been conducted on development of a higher-performance substrate on which a silicon film is formed.

Conventionally, in a case where a polysilicon film is used as a silicon film, it has been a tendency for the following problems (i) and (ii) to occur: (i) a localized level occurs in a gap due to imperfection in crystallinity; and (ii) a localized level occurs in a defective gap near a grain boundary. The occurrence of any of such localized energy levels has caused problems such as a decrease in mobility and/or an increase in subthreshold coefficient (S coefficient) in transistors. This ultimately caused a degradation in performance of the transistors.

Further, in a case where the silicon film of a polysilicon film has defective crystallinity, fixed electric charge were easily generated in an interface between the silicon film and a gate insulating film in a thin film transistor. This generation of such fixed electric charge made it difficult to control a threshold voltage of the thin film transistor, and made it difficult to achieve a desired threshold voltage.

In a case where a polysilicon film is formed by heating an amorphous silicon film by laser beam irradiation, transistors prepared from the polysilicon film greatly varied in their mobilities and their threshold voltages. This is because the size of grains in the polysilicon film that has been irradiated by laser beam is not uniform due to the fluctuation in energy level of the laser beam.

During laser heating, there occurred an instantaneous temperature rise, up to around a melting point of silicon, in a polysilicon film which was being formed by the laser heating of the amorphous silicon film. This occasionally caused an element such as an alkali metal contained in the glass substrate to be diffused in the silicon film, thereby deteriorating transistor characteristics.

In view of the circumstances, studies have been conducted on devices employing single-crystal silicon so as to address the above problems caused by employing a polysilicon film.

An example of a device employing the single-crystal silicon is disclosed in Patent Literature 1 (Japanese Patent Application Publication, Tokukai, No. 2004-134675 A; Publication Date: Apr. 30, 2004).

Specifically, Patent Literature 1 discloses a light-transmitting substrate (glass substrate) on which a coating film and a single-crystal silicon thin film are formed in this order, the single-crystal silicon thin film being divided into layers by implanting hydrogen ions into a single-crystal transferred member.

According to the conventional light-transmitting substrate, however, a problem was caused that bubbles were generated between the glass substrate and the single-crystal silicon thin film. The bubbles generated between the glass substrate and the single-crystal silicon thin film refer to minute air bubbles generated between the glass substrate and the single-crystal silicon thin film. The single-crystal silicon thin film floats above the glass substrate in a region where bubbles are generated. Thus, the single-crystal silicon thin film is not in contact with the glass substrate in such a region. This is further described below.

First, with reference to (a) through (e) of FIG. 7, the following describes a structure of a SOI substrate and a method for producing the SOI substrate as an example of the conventional substrate. (a) through (e) of FIG. 7 are cross-sectional views schematically illustrating a process of producing the SOI substrate.

As illustrated in (e) of FIG. 7, which is a cross-sectional view schematically illustrating an arrangement of the SOI substrate, a transferred substrate 170 includes a light-transmitting substrate 120 such as a glass substrate; and a single-crystal silicon thin film 150 formed on the light-transmitting substrate.

The transferred substrate 170 is generally produced as follows.

First, the following members (i) and (ii) are prepared: (i) the light-transmitting substrate 120, such as a glass plate, serving as a supporting substrate for the SOI substrate; and (ii) a single-crystal transferred member 160 (see (a) and (b) of FIG. 7).

Then, as illustrated in (c) of FIG. 7, a separatory substance is implanted into the single-crystal transferred member 160. Specifically, hydrogen ions serving as the separatory substance are implanted into the single-crystal transferred member 160 via a surface (implantation surface 162), more specifically via a substantial entirety of the implantation surface 162 (as indicated by arrows shown in (c) of FIG. 7).

The hydrogen ions, thus implanted in the single-crystal transferred member 160, reach and stay at a predetermined depth from the implantation surface 162. This allows a peeled layer 110 to be formed.

Next, as illustrated in (d) of FIG. 7, the single-crystal transferred member 160 illustrated in (c) of FIG. 7 is combined with the light-transmitting substrate 120 illustrated in (a) of FIG. 7. The single-crystal transferred member 160 is combined with the light-transmitting substrate 120 so that the implantation surface 162 is in contact with the light-transmitting substrate 120.

Then, the single-crystal transferred member 160 is divided (peeled) so that the single-crystal silicon thin film 150 is formed on the light-transmitting substrate 120.

Specifically, the light-transmitting substrate 120 with which the single-crystal transferred member 160 has been combined is heated at a high temperature such as 600° C. This heating causes a rapid cubical expansion of the hydrogen forming the peeled layer 110, and consequently generates a blister in the peeled layer 110 (more specifically, in a region of the peeled layer 110 in which region the hydrogen ions have the highest concentration). As illustrated in (e) of FIG. 7, this causes the single-crystal transferred member 160 to be separated or peeled along the peeled layer 110 serving as an interface. On this account, the transfer substrate 170 is formed which is the light-transmitting substrate 120 on which the single-crystal silicon thin film 150 is formed.

The above description deals with the case where the SOI substrate is obtained by combining the single-crystal transferred member 160 with the light-transmitting substrate 120 so that the single-crystal silicon thin film 150 is provided on the light-transmitting substrate 120. However, instead of the single-crystal transferred member 160 (semiconductor film), a semiconductor substrate (semiconductor device) on which devices and the like are formed in advance can be combined with the light-transmitting substrate 120 by use of a similar method.

The transfer substrate 170 produced by the above method, however, had at least the problem that the bubbles were generated in an interface (see IF shown in FIG. 8) between the single-crystal silicon thin film 150 and the light-transmitting substrate 120.

Specifically, bubbles 180 are generated in the interface IF between the single-crystal silicon thin film 150 and the light-transmitting substrate 120 (see FIG. 8 which is a cross-sectional view illustrating the transfer substrate 170). The single-crystal silicon thin film 150, which has been transferred onto the light-transmitting substrate 120, is floated above the light-transmitting substrate 120 in a region where the bubbles 180 are generated.

The bubbles 180 are generated due to various reasons. It is often the case that the bubbles 180 are generated during the step of heating the single-crystal transferred member 160 which has been combined with the light-transmitting substrate 120 so that the peeled layer 110 is separated from the single-crystal transferred member 160.

In other words, the bubbles 180 appear to be liable to generate during a heating step which causes the semiconductor film or the semiconductor substrate on which the device and the like is formed to be peeled along the peeled layer. The heating step is carried out after combining the semiconductor film or the semiconductor substrate on which the device and the like is formed with the light-transmitting substrate 120. It appears to be the case that the bubbles 180 are often generated due to concentration of hydrogen and/or water contained in the semiconductor film and other members occurs in a part of the transferred interface IF in which part binding energy is weak.

Any transferred substrate, in which the bubbles 180 are generated in the transfer interface IF as illustrated in FIG. 8, is incapable of being used as an intended transferred substrate. This caused a reduction in yield of producing transferred substrates.

SUMMARY OF INVENTION

The present invention has been accomplished in view of the problems. It is an object of the present invention to provide (i) a method for producing a semiconductor device which method is difficult to generate a bubble in a transferred interface and (ii) a semiconductor device produced by the method.

In order to solve the above problems, a method of the present invention for producing a semiconductor device includes the steps of: (a) forming a peeled layer in a transferred member by implanting a peeled-layer-forming substrate into the transferred member; (b) forming a planar surface of the transferred member by planarizing a surface of the transferred member; (c) forming a composite including the transferred member and a glass substrate by directly combining the transferred member, via the planar surface, with a surface of the glass substrate; and (d) peeling a part of the transferred member from the composite by carrying out a heat treatment with respect to the composite, the peeled layer serving as an interface.

According to the above arrangement, the transferred member is combined directly with the glass substrate. This causes the glass substrate to have plenty of space in which, e.g., $H_2$ and $H_2O$ can be diffused. Further, such a transferred member is combined with the glass substrate to form a composite. This allows for diffusion, in the glass substrate, of $H_2$, $H_2O$ and the like generated due to the heat treatment for the composite. This in turn prevents, e.g., $H_2$ and $H_2O$ from accumulating in the interface between the transferred member and the glass substrate, thereby preventing the occurrence of bubbles.

The method of the present invention for producing a semiconductor device may preferably be arranged such that the glass substrate is unbaked.

According to the above arrangement, an unbaked glass substrate is combined directly with the transferred member. The glass substrate is desirably unbaked because such a glass substrate has a larger space for diffusion of, e.g., $H_2$ and $H_2O$. This facilitates the diffusion, in the glass substrate, of $H_2$, $H_2O$ and the like generated due to the heat treatment for the composite. This in turn prevents, e.g., $H_2$ and $H_2O$ from accumulating in the interface between the transferred member and the glass substrate, thereby preventing the occurrence of bubbles.

In order to solve the above problems, a method of the present invention for producing a semiconductor device includes the steps of: (a) forming a peeled layer in a transferred member by implanting a peeled-layer forming substrate into the transferred member; (b) forming a planar surface of the transferred member by planarizing a surface of the transferred member; (c) forming a composite including the transferred member and a glass substrate by combining the transferred member, via the planar surface, with the glass substrate; and (d) peeling a part of the transferred member from the composite by carrying out a heat treatment with respect to the composite, the peeled layer serving as an interface, wherein the step (d) includes the step, (e) rapidly lowering a temperature of the composite from which the part of the transferred member has been peeled, after the heat treatment.

Mainly during the heat treatment for the composite, $H_2$, $H_2O$ and the like tend to be generated in the composite and accumulated in the interface between the transferred member and the glass substrate. Further, partially peeling the transferred member from the composite decreases an internal pressure (i.e., pressure acting between the transferred member and the glass substrate) of the composite, and thus decreases an adhesion between the transferred member and the glass substrate. This in turn tends to cause, e.g., $H_2$ and $H_2O$ to accumulate in the interface and let such $H_2$, $H_2O$ and the like thus accumulated form bubbles.

In view of this, the above arrangement rapidly lowers, after the heat treatment, the temperature of the composite from which a part of the transferred member has been peeled, i.e., the composite including a part of the transferred member and the glass substrate. This allows the prevention of $H_2$, $H_2O$ and the like as above from moving or forming bubbles (air bodies) in the composite. This in turn prevents, e.g., $H_2$ and $H_2O$ from accumulating in the interface between the transferred member and the glass substrate, thereby preventing the occurrence of bubbles.

The method of the present invention for producing a semiconductor device may preferably be arranged such that, in the step (e), the temperature of the composite is lowered at a temperature-lowering rate of not smaller than 2° C./sec.

The method of the present invention for producing a semiconductor device may preferably be arranged such that, in the step (e), the temperature of the composite is lowered at a temperature-lowering rate of not smaller than 5° C./sec.

The method of the present invention for producing a semiconductor device may preferably be arranged such that, in the step (e), the temperature of the composite is lowered at a temperature-lowering rate of not smaller than 10° C./sec.

The above arrangement rapidly lowers, after the heat treatment, the temperature of the composite from which a part of the transferred member has been peeled. This in turn prevents, e.g., $H_2$ and $H_2O$ from accumulating in the interface between the transferred member and the glass substrate, thereby preventing the occurrence of bubbles.

The method of the present invention for producing a semiconductor device may preferably be arranged such that, in the step (b), the planar surface is formed by forming an insulating film on the transferred member, and then planarizing a surface of the insulating film.

The above arrangement increases the adhesion between the transferred member and the glass substrate with use of the insulating film interposed between the transferred member and the glass substrate. In other words, the above arrangement increases a binding energy between the transferred member and the glass substrate with use of the insulating film interposed between them. $H_2$, $H_2O$ and the like generated due to the heat treatment for the composite tend to accumulate in a region in the interface, the region being low in the adhesion between the transferred member and the glass substrate, i.e., in a region in the interface, the region being weak in the binding energy. The above arrangement causes the adhesion of the transferred member to the glass substrate to be high along the entire interface. This in turn prevents, e.g., $H_2$ and $H_2O$ from accumulating in the interface.

The method of the present invention for producing a semiconductor device may preferably be arranged such that the insulating film is a silicon oxide film.

The above arrangement increases the adhesion between the transferred member (e.g., semiconductor on which a device is formed) and the glass substrate.

The method of the present invention for producing a semiconductor device may preferably be arranged such that, in the step (b), the surface is planarized by chemical mechanical polishing.

The above arrangement allows the planar surface to be formed by a simple method.

The method of the present invention for producing a semiconductor device may preferably be arranged such that, in the step (c), the transferred member is subjected to a heat treatment in vacuum at a temperature of not higher than 350° C., before the transferred member is combined with the glass substrate.

The above arrangement causes the transferred member to be treated at a high temperature before the transferred member is combined with the glass substrate. This removes, e.g., $H_2$ and $H_2O$ in the transferred member in advance. This indicates that the heat treatment causes the transferred member to secure in itself a space in which newly generated $H_2$ and $H_2O$, for example, can be absorbed. The above arrangement causes such a transferred member to be combined with the glass substrate to form a composite. This allows for diffusion, in the transferred member, of $H_2$, $H_2O$ and the like generated due to the heat treatment for the composite. This in turn prevents, e.g., $H_2$ and $H_2O$ from accumulating in the interface between the transferred member and the glass substrate.

The method of the present invention for producing a semiconductor device may preferably be arranged such that the composite is kept at a temperature of lower than 350° C., before the heat treatment is carried out with respect to the composite.

The above arrangement increases the binding energy in the interface. This in turn prevents the occurrence of bubbles.

The method of the present invention for producing a semiconductor device may preferably be arranged such that, in the step (d), the composite is heated to a temperature which falls within a range from 400° C. to 700° C.

According to the above arrangement, the peel temperature is sufficiently high. This facilitates partially peeling the transferred member from the composite along the peeled layer serving as an interface.

The method of the present invention for producing a semiconductor device may preferably be arranged such that, in the step (d), the heat treatment is carried out with respect to the composite for a time period of not longer than 60 seconds.

The method of the present invention for producing a semiconductor device may preferably be arranged such that, in the step (d), the heat treatment is carried out with respect to the composite for a time period of not longer than 30 seconds.

The method of the present invention for producing a semiconductor device may preferably be arranged such that, in the step (d), the heat treatment is carried out with respect to the composite for a time period of not longer than 10 seconds.

According to the above arrangement, the heat treatment is performed for a sufficiently short period. This reduces an amount of, e.g., $H_2$ and $H_2O$ generated due to the heat treatment, and further prevents such $H_2$, $H_2O$ and the like thus generated from moving in the composite. This prevention of $H_2$ and $H_2O$ generated as above from moving in the composite consequently prevents such $H_2$ and $H_2O$ from accumulating in the interface between the transferred member and the glass substrate.

The method of the present invention for producing a semiconductor device may preferably be arranged such that, in the step (d), the composite is heated to a temperature of not higher than (a separation temperature+20° C.).

The above arrangement prevents $H_2$ and $H_2O$ from accumulating in the interface between the transferred member and the glass substrate.

The method of the present invention for producing a semiconductor device may preferably be arranged such that the heat treatment includes a temperature-raising step, the temperature-raising step, including: a first temperature-raising step; and a second temperature-raising step by which the first temperature-raising step is followed, a temperature-raising rate is lower in the first temperature-raising step than in the second temperature-raising step.

The above arrangement gradually raises the temperature of the composite in the first temperature-raising step. This increases the binding energy in the interface, thereby better preventing the occurrence of bubbles.

The method of the present invention for producing a semiconductor device may preferably be arranged such that the heat treatment includes a temperature-raising step, the temperature-raising step including: a first temperature-raising step; and a second temperature-raising step by which the first temperature-raising step is followed; and an initial temperature, in the second temperature-raising step, falls within a range from (a separation temperature−150° C.) to the separation temperature.

The above arrangement gradually raises the temperature of the composite in the first temperature-raising step. This increases the binding energy in the interface, thereby better preventing the occurrence of bubbles.

The method of the present invention for producing a semiconductor device may preferably be arranged such that the heat treatment is carried out with respect to the composite under a pressure above one atmosphere.

The above arrangement causes a pressure to be constantly applied to the composite during the heat treatment for the composite. This causes a pressure higher than one atmosphere to be applied to the composite even after the transferred member is partially peeled from the composite along the peeled layer serving as an interface. In other words, the above pressure increases the adhesion between the transferred member, remaining in the composite after the peeling, and the glass substrate. This in turn prevents, e.g., $H_2$ and $H_2O$ from accumulating in the interface between the transferred member and the glass substrate.

The method of the present invention for producing a semiconductor device may preferably be arranged such that the pressure is applied on the composite with use of a pressing method.

The above arrangement causes a pressure to be uniformly applied to the composite by a simple method.

The method of the present invention for producing a semiconductor device may preferably be arranged such that the peeled-layer forming substrate is hydrogen or a noble gas.

The above arrangement not only forms a peeled layer in the transferred member, but also provides the peeled layer with a property of causing a peel due to the heat treatment.

The method of the present invention for producing a semiconductor device may preferably be arranged such that the transferred member is a single-crystal chip, a semiconductor chip, or a semiconductor device.

The above arrangement allows for production of a desired semiconductor device.

In order to solve the above problems, a semiconductor device of the present invention is a semiconductor device produced by any one of the above methods and arranged such that a bubble density is not more than five bubbles/cm$^2$.

The above arrangement reduces the bubble density to not more than five bubbles/cm$^2$.

The semiconductor device of the present invention may be arranged such the bubbles each have a diameter of not smaller than 10 μm.

The above arrangement prevents, e.g., $H_2$ and $H_2O$ from accumulating in the interface between the transferred member and the glass substrate.

The semiconductor device of the present invention may preferably include a gate oxide film serving as a thermal oxide film.

The above arrangement prevents, e.g., $H_2$ and $H_2O$ from accumulating in the interface between the transferred member and the glass substrate.

In order to solve the above problems, a semiconductor device of the present invention is a semiconductor device in which a device is provided on a first substrate by combining the device produced on a semiconductor substrate with the substrate, a channel region of the device being made of single crystal; and a gate electrode of the device being made of polycrystalline silicon.

The above arrangement prevents, e.g., $H_2$ and $H_2O$ from accumulating in the interface between the transferred member and the glass substrate.

The semiconductor device of the present invention may preferably be arranged such that the first substrate has a surface on which an insulating layer is provided.

The above arrangement prevents, e.g., $H_2$ and $H_2O$ from accumulating in the interface between the transferred member and the glass substrate.

Additional objects, features, and strengths of the present invention will be made clear by the description below. Further, the advantages of the present invention will be evident from the following explanation in reference to the drawings.

Figure 1:
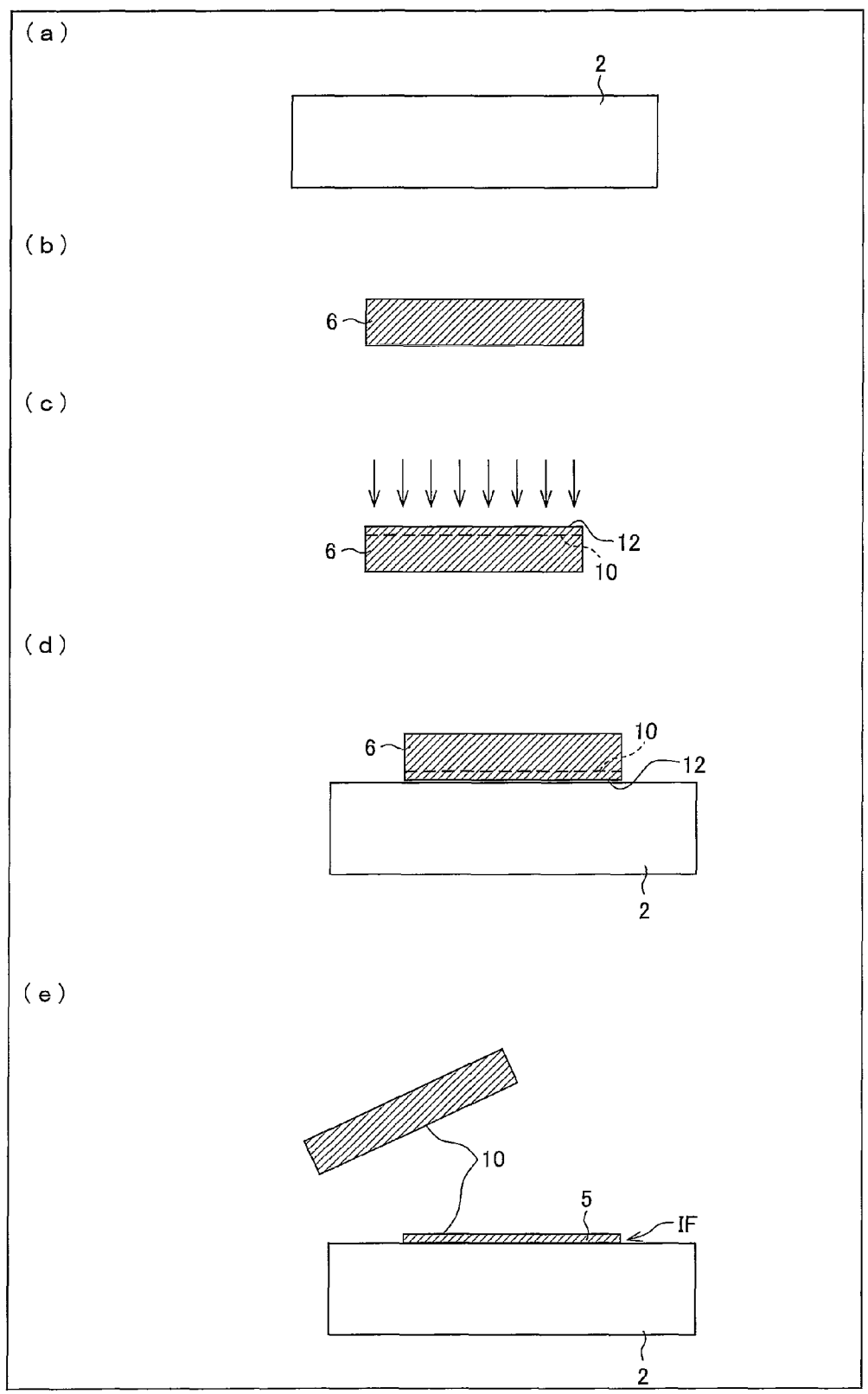
FIG. 1 is a cross-sectional view illustrating how a semiconductor device is produced through steps of a method in accordance with an embodiment of the present invention.

REFERENCE SIGNS LIST 2 glass substrate
6 transferred member
5 silicon thin film
9 poly-Si TFT
10 peeled layer
12 implantation surface
110 peeled layer
120 light-transmitting substrate
150 single-crystal silicon thin film
160 single-crystal transferred member
162 implantation surface
170 transfer substrate
180 bubble

DESCRIPTION OF EMBODIMENTS

One embodiment of the present invention is described below with reference to (a) through (e) of FIG. 1 and FIG. 2.

(a) through (e) of FIG. 1 are cross-sectional views illustrating respective steps in a method of the present embodiment for producing the semiconductor device. FIG. 2 is a flowchart showing steps in the method of the present embodiment for producing the semiconductor device.

As illustrated in (c) of FIG. 1, the method of the present embodiment for producing a semiconductor device includes a step of implanting a peeled-layer forming substance into a transferred member 6 so that a peeled layer 10 is formed in the transferred member 6.

The transferred member 6 is not particularly limited to any specific kind. The transferred member 6 preferably contains silicon, for example. More specifically, the transferred member 6 is preferably a single-crystal chip, a semiconductor chip, or a semiconductor device. This allows a target arrangement to be transferred onto a glass substrate (later described). That which is produced by a known method can be used as the transferred member 6, or that which is ready-made and is commercially available can be used as the transferred member 6 (see S1 and S2 of FIG. 2).

The transferred member 6 preferably has a surface film on its top surface. This allows an increase in adhesion of the transferred member 6 to the glass substrate (later described).

In a case where a silicon oxide film is employed as a surface film of the transferred member 6 (single-crystal silicon substrate), the top surface of the single-crystal silicon substrate merely needs to be thermally oxidized. This allows a silicon oxide film to be formed on the transferred member 6. A thickness of the silicon oxide film is not particularly limited. For example, the thickness preferably falls within a range from 5 nm to 300 nm, and more preferably from 5 nm to 100 nm. The silicon oxide film most preferably has a thickness of approximately 100 nm. Note that the specific thickness ranges are preferable particularly in a case where the transferred member 6 is a single-crystal silicon substrate.

The peeled-layer forming substance is also not particularly limited to any specific one, provided that it can form a peeled layer. The "peeled layer" in the present specification is intended to be a layer in which a peeling occurs, the peeling allowing a part of the transferred member to be peeled from a composite when the composite is heated during a later step. The peeled-layer forming substance is preferably, for example, hydrogen or a noble gas such as He, Ne, or Ar. With the arrangement, it is possible for a part of the transferred member to be readily peeled from the composite, by heating the composite, along the peeled layer serving as an interface (border).

The peeled layer 10 is formed by implanting, as indicated by arrows shown in (c) of FIG. 1, the peeled-layer forming substance into the transferred member 6 via an implantation surface 12. A method for implanting the peeled-layer forming substance into the transferred member 6 is not particularly limited. A known method can be employed for the implantation as appropriate. For example, an ion implanting method can be employed but is not limited to this.

In a case where, for example, hydrogen is used as the peeled-layer forming substance, it is preferable during the implanting that an acceleration energy falls within a range from 100 keV to 200 keV, an implanting rate falls within a range from $2 E 16 \, cm^{-2}$ to $1 E 17 \, cm^{-2}$. Known literature (e.g., "SILICON WAFER BONDING TECHNOLOGY for VLSI and MEMS applications", S. S. Iyer and A. J. Auberton-Herve; published in 2002) can predict (i) conditions under which the peeled-layer forming substance should be implanted and (ii) a peel temperature (separation temperature) of a peeled layer formed by implanting the peeled-layer forming substance.

The implantation surface 12 of the transferred member 6, via which surface the peeled-layer forming substance is implanted, is not limited to a specific one. Thus, it is possible to select an implantation surface 12 as appropriate in accordance with where the peeled layer 10 is to be formed. As illustrated, for example, in (c) of FIG. 1, it is preferable to select one of the surfaces of the transferred member 6 and drive the peeled-layer forming substance into the transferred member 6 through the one of the surfaces.

A location (e.g., depth) where the peeled layer 10 is formed in the transferred member 6 is not particularly limited. Thus, the peeled layer can be desirably located as appropriate. The peeled layer 10 is preferably formed, e.g., near a surface of the transferred member 6. This allows a thin silicon film to be formed on the glass substrate.

In a case where a device is formed on the transferred member 6, it is not preferable to heat the transferred member 6 at a high temperature in any process after the peeled-layer forming substance is implanted into the transferred member 6. Specifically, in a case where the transferred member 6 is heated at a temperature of not lower than a blister generating temperature after the peeled-layer forming substance is implanted into the transferred member 6, a part of the transferred member 6 will be peeled (separated) before the transferred member 6 is transferred onto the glass substrate 2. On the other hand, in a case where the transferred member is heated at a temperature lower than a peel (separation) temperature after the peeled-layer forming substance is implanted in the transferred member 6, the peeled-layer forming substance will escape from the transferred member 6. This causes the part of the transferred member 6 not to be peeled from the transferred member 6 after the transferred member 6 is transferred onto the glass substrate 2.

In view of the circumstances, in a case of forming, e.g., a MOS transistor, it is preferable that the following steps are sequentially carried out: A gate electrode is formed; a high-temperature treatment such as an activation treatment in which impurities for source and drain are implanted is carried out; an insulating film is formed on a surface of the device; the insulating film is planarized; a peeling substance is implanted into the device; source and drain metals are formed on the device; an oxide film is formed on the surface of the device; the oxide film is planarized; and a transferring step is carried out.

The method of the present embodiment for producing a semiconductor device includes a step of planarizing a surface of the transferred member 6 so that a planar surface is achieved.

At least a part of the planar surface simply needs to function in a later step as a surface via which the transferred member 6 is combined with the glass substrate 2. Therefore, the planar surface is not limited to (i) a specific part of the transferred member and (ii) a specific area on the transferred member.

The planar surface can be formed by carrying out a surface treatment with respect to a surface of the transferred member 6 itself. Specifically, it is possible, in a later step, to combine the transferred member 6 on which a planar surface has been formed (see 1(*c*) of FIG. 1 with the glass substrate 2. In a case where the planar surface is formed by carrying out surface treatment with respect to the surface of the transferred member 6 itself, it is possible to simplify the steps of producing a semiconductor device. This enables semiconductor devices to be produced more efficiently at a lower cost.

Alternatively, it is possible to form the planar surface by forming an insulating film on the transferred member, and then by planarizing the insulating film. In this case, the insulating film is preferably a silicon oxide film.

With the arrangement, it is possible that the transferred member 6 is reliably combined with the glass substrate 2 via the planar surface. This consequently allows the transferred member 6 to be more firmly transferred onto the glass substrate 2 during the transferring step.

A method for forming the planar surface is not particularly limited. A known method can be employed as appropriate for formation of the planar surface. For example, chemical mechanical polishing (CMP) is preferably employed. This allows the planar surface to be formed easily by a known method.

According to the method of the present embodiment for producing a semiconductor device, the transferred member 6 is preferably subjected to a heat treatment in vacuum before it is combined with the glass substrate 2 (later described) so that a composite is formed. A temperature of the heat treatment is not particularly limited to any specific one. However, it is preferable that the heat treatment is carried out at a temperature of not higher than 350° C., for example.

According to the arrangement, the transferred member 6 is thermally treated at a high temperature in vacuum before it is combined with the glass substrate 2. This allows $H_2$, $H_2O$ and the like contained in the transferred member 6 to be removed in advance. In other words, it is possible to secure in itself a space in which newly generated $H_2$, $H_2O$ and the like can be absorbed. In a later step, it is possible to diffuse, toward the transferred member 6, $H_2$, $H_2O$ and the like caused by the thermal treatment for forming a composite which thermal treatment is carried out when the transferred member 6 is combined with the glass substrate 2. This allows for preventing $H_2$, $H_2O$ and the like from accumulating in an interface between the transferred member 6 and the glass substrate 2.

A method for heating the transferred member 6 is not limited to any specific one. The transferred member can be heated as appropriate by use of a known device or a known method. For example, the transferred member 6 can be heated with use of a vacuum oven. However, the method is not limited to this.

As illustrated in (d) of FIG. 1, the method of the present embodiment for producing a semiconductor device includes a step of directly combining the transferred member 6 with the glass substrate 2 via the planar surface so that a composite including the transferred member 6 and the glass substrate 2 is formed. The following describes the glass substrate 2.

According to the method of the present embodiment for producing a semiconductor device, the transferred member 6 is preferably combined directly with the glass substrate 2. The glass substrate 2 is preferably an unbaked glass substrate.

The glass substrate 2 is not limited to any specific kind. A known glass substrate can be used as the glass substrate 2 as appropriate. That which is produced by a known method can be used as the glass substrate 2, or that which is ready-made and is commercially available can be used as the glass substrate 2 (see S11 and S12 of FIG. 2). For example, the glass substrate 2 is preferably a light-transmitting, alkali-free amorphous glass substrate having a high strain point. More specifically, the glass substrate is preferably an alkaline earth-aluminoborosilicate glass such as Corning (registered trademark) 1737 glass manufactured by Corning Incorporated.

As mentioned above, the glass substrate 2 is preferably an unbaked glass substrate. A normal process of producing a semiconductor device includes a step of heating a glass substrate at a temperature falling within a range from 600° C. to 700° C. so that the glass substrate is baked. In contrast, according to the method of the present embodiment for producing a semiconductor device, such a step is intentionally omitted. This allows a larger space in which $H_2$, $H_2O$, and the like can be diffused to be secured in the glass substrate.

An oxide film (not shown) can be formed on the surface of the glass substrate 2. A thickness of the oxide film is not limited to any specific one. The thickness preferably falls within a range from 5 nm to 100 nm, and is more preferably and not more than approximately 10 nm.

A method for forming the oxide film is not limited to any specific one. The oxide film can be formed by use of a known forming method as appropriate. The oxide film having a desired thickness (e.g., 100 nm) is preferably formed, e.g., by use of plasma chemical vapor deposition (plasma CVD). According to the plasma CVD, tetra ortho silicate (TEOS) gas and oxygen gas are mixed with each other in a vacuum chamber, and a plasma discharge is carried out at a temperature of about 320° C. (Plasma-enhanced CVD using TEOS and $O_2$).

Figure 2:
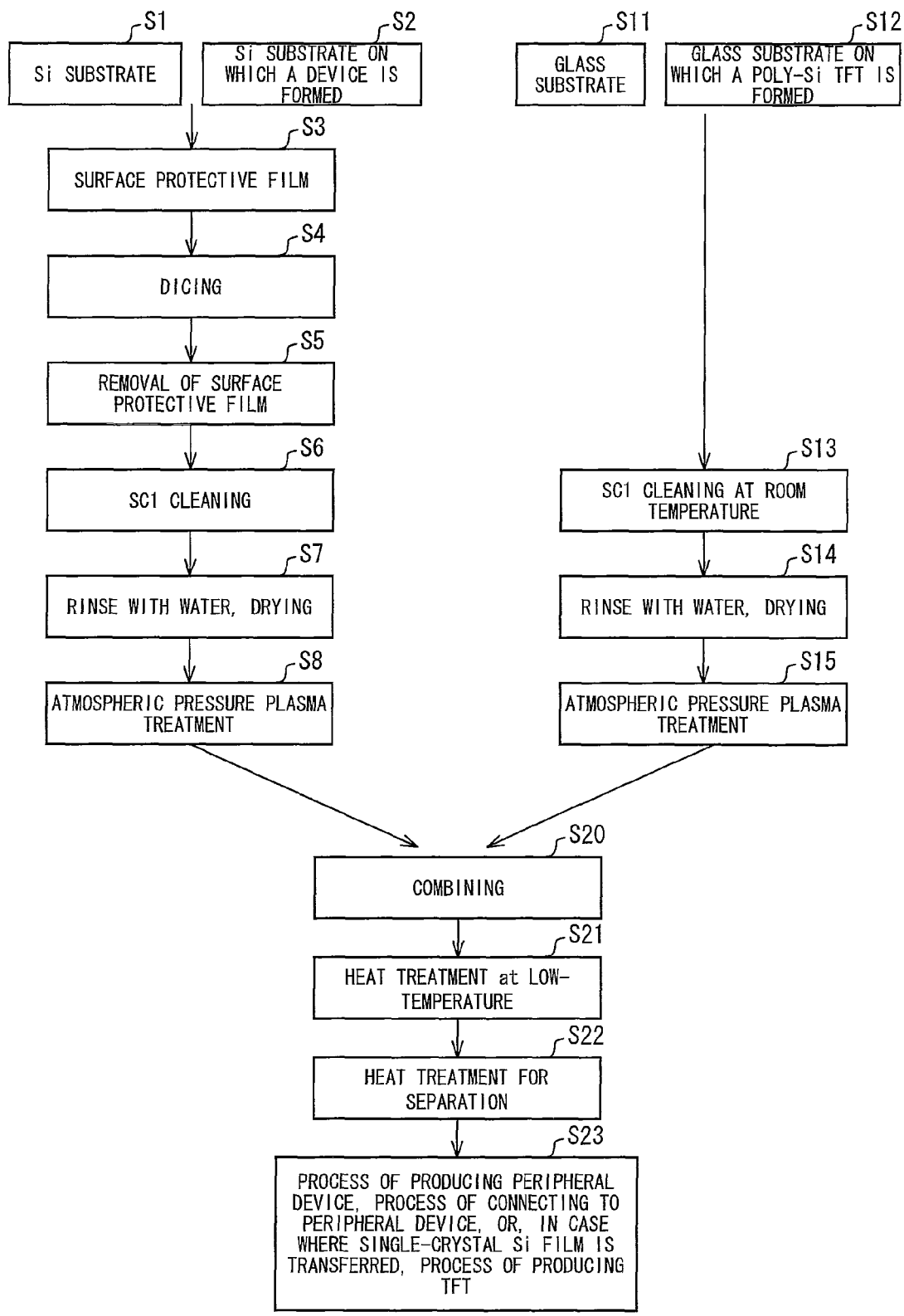
FIG. 2 is a flowchart showing respective steps of the method for producing a semiconductor device in accordance with the embodiment of the present invention.

As illustrated in (d) of FIG. 1, the method of the present embodiment for producing a semiconductor device includes a step of directly combining the transferred member 6 with the glass substrate 2 so that a composite is formed (see S20 in FIG. 2). The following describes this step.

According to the method of the present embodiment for producing a semiconductor device, the transferred member 6 and the glass substrate 2 is preferably joined without use of an adhesive. To this end, prior to the joining, both the glass substrate 2 and the transferred member 6 are preferably cleaned with SC1 solution, and dried (see S6, S7, S13, and S14 in FIG. 2). This is because this joining is significantly affected by a surface state a surface cleanness and a surface activeness of each transferred surface. A composition of the SC1 solution is described below in detail.

The joining of the transferred member 6 and the glass substrate 2 is achieved mainly by van der Waals force.

In a case where the transferred member 6 is cleaned with the SC1 solution, it is also possible, prior to cleaning the transferred member 6, that the transferred member 6 is diced after forming a surface protective film on a surface of the transferred member 6 (see S3 and S4 in FIG. 2). A known protective film can be used, as appropriate, as the surface protective film. A method for forming the surface protective film is not limited to any specific one. Thus, the surface protective film can be formed by use of a known method as appropriate. Further, the dicing method is not limited to any specific one. The dicing can be made by use of a known dicing method as appropriate. The surface protective film is preferably removed after the dicing (see S5 in FIG. 2). A removal method is not limited to any specific one. The surface protective film can be removed by use of a known method as appropriate in accordance with a composition of the surface protective film. After the surface protective film is removed, the transferred member 6 diced as above is cleaned with the SC1 solution (see S6 in FIG. 2).

The SC1 solution can be prepared, for example, by mixing commercially available ammonia water ($NH_4OH$: 30% solution), hydrogen peroxide water ($H_2O_2$: 30% solution), and pure water ($H_2O$) in predetermined proportions. It is preferable to satisfy (ammonia water:hydrogen peroxide water: pure water)=(5:12:60). However, the proportions are not limited to these. It is possible to clean the glass substrate 2 and the transferred member 6 by immersing them in the SC1 solution, for example, at room temperature for ten minutes (see S6 and S13 in FIG. 2). Although the glass substrate and the transferred member are cleaned for ten minutes in the above example, the cleaning period is not limited to any specific one. However, as described in "Urutora-kuriin ULSI Gizyutsu (Ultraclean ULSI Technology; Tadahiro Ohmi, Baifukan, p 172)", ammonia water slightly etches a surface of a silicon oxide film. As such, it is not preferable that the glass substrate and the transferred member are immersed for a long stretch of time. Therefore, the cleaning period is preferably not longer than ten minutes.

The transferred member 6 and the glass substrate 2 that have been cleaned with the SC1 solution are preferably rinsed under running pure water for 10 minutes. This allows a removal of the SC1 solution from the transferred member 6 and the glass substrate 2. As such, it is possible to prevent the surface of the silicon oxide from being slightly etched. The pure water for the rinsing is not limited to any specific one. The pure water preferably has, for example, a specific resistance of not less than 10M Ωcm. The transferred member 6 and the glass substrate 2 that have been rinsed with the pure water are preferably dried rapidly by, e.g., a spin dryer (see S7 and S14 in FIG. 2).

According to the method of the present embodiment for producing a semiconductor device, after the transferred member 6 that has been cleaned as above is directly combined with the glass substrate 2 so as to form a composite including the transferred member 6 and the glass substrate 2, the composite is thermally treated so that a part of the transferred member 6 is peeled (separated) from the composite (see S22 in FIG. 2). This causes the other part of the transferred member 6 to remain on the glass substrate 2, thereby forming a thin film (e.g., silicon thin film) on the glass substrate 2. The peeling occurs along the peeled layer 10 serving as an interface. Specifically, the peeling occurs such that a peeled surface is formed, in the peeled layer 10, along the peeled layer 10. The following describes this step.

The thermal treatment of the composite mainly includes a temperature-raising step, a heating step, and a temperature-lowering step. The heat treatment can be carried out by annealing with use of an electric furnace or by annealing with use of a lamp. The following describes the above steps.

The temperature-raising step is for raising a temperature of the composite to a temperature at which the part of the transferred member 6 is peeled from the composite.

The temperature at which the part of the transferred member 6 is peeled from the composite is not particularly limited. The temperature, for example, preferably falls within a range from 400° C. to 700° C., more preferably within a range from 450° C. to 650° C., and most preferably within a range from 500° C. to 600° C. More specifically, the above temperature is preferably selected as appropriate in accordance with, e.g., a kind of the transferred member 6.

A temperature-raising rate during the temperature-raising step is not limited to any specific one. The temperature-raising rate is preferably, for example, not more than 200° C./min, or more preferably not more than 150° C./min. This prevents a blister from occurring in response to a rapid temperature rise.

The term "blister" used in the present specification intends to an air bubble, which occurs in the peeled layer 10 when the peeled-layer forming substance, in a portion (layer) of the peeled layer 10 in which portion the peeled-layer forming substance has the highest concentration, has rapidly expanded in volume in response to the peeled-layer forming substance being heated in the portion to a temperature of not less than a given temperature. The occurrence of the blister causes the transferred member 6 to be divided along the peeled layer 10 serving as an interface for the division. This allows the part of the transferred member 6 to be peeled from the composite. In other word, the blister is an air bubble whose occurrence is necessary only when a part of the transferred member 6 is to be peeled. If the composite is subjected to a heat treatment at a temperature of not higher than a blister generating temperature, then the peeled-layer forming substance such as hydrogen will escape from the peeled layer 10. If the peeled-layer forming substance escapes from the peeled layer 10 in large quantity, then no peeling will occur in response to a temperature rise. Therefore, the temperature of the composite needs to be controlled with care.

The temperature of the composite can be raised at a constant temperature-raising rate throughout the temperature-raising step. In this case, the temperature-raising step can be divided into a plurality of sub-steps, and in each step the temperature of the composite can be raised at a different temperature-raising rate. In view of reliably preventing the occurrence of the blister, the temperature-raising step is preferably divided into a plurality of sub-steps.

The number of the sub-steps included in the temperature-raising step is not limited to any specific one. The number can be selected as appropriate according to need. In the case where the temperature-raising step is divided into a plurality of sub-steps, the temperature of the composite is preferably raised in a later sub-step at a greater temperature-raising rate.

In a case where, for example, the temperature-raising step includes a first temperature-raising step and a second temperature-raising step by which the first temperature-raising step is followed, the temperature of the composite is preferably raised in the first temperature-raising step at a temperature-raising rate which is smaller than that of the second temperature-raising step. This allows a gradual raise in temperature of the composite, and it is therefore to better prevent the occurrence of the blister.

In the case where, for example, the temperature-raising step includes the first temperature-raising step and the second temperature-raising step by which the first temperature-raising step is followed, the temperature of the composite is preferably raised in the second temperature-raising step from an initial temperature that falls within a range from a temperature of (a separation temperature−150° C.) to the separation temperature. The separation temperature intends to a temperature at which a part of the transferred member 6 is peeled (separated) from the composite during the later heating step.

It is possible to increase binding energy in the interface, by gradually raising the temperature of the composite during the first half of the temperature-raising step. Further, it is possible to achieve the peeling while preventing bubbles from occurring, by rapidly raising the temperature of the composite during the second half of the temperature-raising step. This better allows the prevention of bubbles from occurring between the transferred member 6 and the glass substrate 2.

As described above, in the case where the temperature-raising step includes a plurality of sub-steps (e.g., the first and second temperature-raising steps), the temperature-raising rates in the respective sub-steps are not limited to any specific ones. For example, a temperature-raising rate in the first temperature-raising step preferably is not greater than that in the second temperature-raising step. More specifically, in the second temperature-raising step, a temperature-raising rate is preferably not smaller than 2° C./min, more preferably not smaller than 5° C./min, or most preferably not smaller than 10° C./min.

The following describes the heating step.

The heating step follows the temperature-raising step, and is a step of separating the composite at a temperature to which the composite is heated during the temperature-raising step. Specifically, the heating step causes a blister to be generated in the peeled layer 10, so that a part of the transferred member 6 is peeled from the composite.

A temperature to which the composite is heated during the heating step is not limited to any specific one. The temperature, for example, preferably falls within a range from 400° C. to 700° C., more preferably within a range from 450° C. to 650° C., or most preferably within a range from 500° C. to 600° C. Note that the temperature is preferably selected as appropriate in accordance with, e.g., a kind of each of the transferred member 6 and the glass substrate 2.

A time period for which the composite is heated during the heating step is also not limited to any specific one, provided that the time period allows a part of the transferred member 6 to be peeled from the composite. For example, the period is preferably not longer than 60 seconds, more preferably not longer than 30 seconds, or most preferably not longer than 10 seconds. The time period is so short that $H_2$, $H_2O$ and the like in the film are unable to move. This in turn allows the prevention of, e.g., $H_2$ and $H_2O$ from accumulating in the interface between the transferred member 6 and the glass substrate 2 in the composite. Consequently, it is possible to prevent bubbles from occurring between the transferred member 6 and the glass substrate 2. In this case, the temperature, which is applied to the composite so that a part of the transferred member 6 is peeled, is preferably not higher than a temperature of (the separation temperature+20° C.).

The following describes the temperature-lowering step.

The temperature-lowering step follows the heating step, and is a step of lowering the temperature of the composite after a part of the transferred member 6 is peeled during the heating step.

In the temperature-lowering step, it is preferable to rapidly lower the temperature of the composite after the transferred member 6 is partially peeled.

Mainly in the heating step, $H_2$, $H_2O$ and the like are generated in the composite, and there is a tend for such $H_2$, $H_2O$ and the like to accumulate in the interface between the transferred member 6 and the glass substrate 2. In addition, when the part of the transferred member 6 is peeled, there occurs a decrease in internal pressure (i.e., pressure acting between the transferred member and the glass substrate) of the composite. This causes a decrease in the adhesion between the transferred member and the glass substrate. This tends to let $H_2$, $H_2O$ and the like accumulate in the interface, and such $H_2$, $H_2O$ and the like thus accumulated further tend to form bubbles.

The above arrangement of the present invention allows a sharp drop, after the heating step, in the temperature of the composite from which one part of the transferred member has been peeled, i.e., the composite which includes the other part of the transferred member and the glass substrate. This allows the prevention of $H_2$, $H_2O$ and the like from moving or forming bubbles in the composite. Therefore, it is possible to prevent, e.g., $H_2$, $H_2O$ and the like from accumulating in the interface between the transferred member and the glass substrate, and to prevent the occurrence of bubbles.

A temperature-lowering rate during the temperature-lowering step is not limited to any specific one. For example, the temperature is preferably lowered, at least immediately after the temperature-lowering has started, at a temperature-lowering rate of not smaller than 2° C./sec, more preferably at a temperature-lowering rate of not smaller than 5° C./sec, and most preferably at a temperature-lowering rate of not smaller than 10° C./sec. The temperature-lowering rate can be maintained constantly throughout the temperature-lowering step. Instead, the temperature-lowering rate can be varied during the temperature-lowering step. In a case where the temperature-lowering rate is varied during the temperature-lowering step, it is preferable that the shorter the time elapses since the start of the temperature-lowering, the more rapidly the temperature is lowered.

Various methods can be employed to rapidly lower the temperature of the composite during the temperature-lowering step. For example, a cooling device can be used to rapidly lower the temperature of the composite from which the part of the transferred member has been peeled. The method is, however, not limited to this.

The thermal treatment (at least the heating step and the temperature-lowering step) is preferably carried out under a pressure above one atmosphere. In other words, it is preferable that the composite is subjected to the thermal treatment under a pressure of above one atmosphere during the thermal treatment.

With the arrangement, it is possible to keep applying a pressure on the composite during the thermal treatment. Therefore, even when the part of the transferred member 6 is peeled from the composite in the peeled layer 10 serving as the interface, a pressure above one atmosphere is applied on the composite. In other words, the pressure causes an increase in the adhesion between the transferred member 6 and the glass substrate 2 which are included in the composite remaining after the peeling.

In a case where the part of the transferred member 6 is peeled from the composite, there is a general tend to decrease the pressure acting between the transferred member 6 and the glass substrate 2. This causes a decrease in the adhesion between the transferred member 6 and the glass substrate 2 in the composite. Such a decrease in the adhesion between the transferred member 6 and the glass substrate 2 causes a small space to be generated in the interface, for example. Then, $H_2$, $H_2O$ and the like accumulate in the space, so that bubbles are generated.

In contrast, the above arrangement maintains a high adhesion between the transferred member 6 and the glass substrate 2 in the composite, and thus prevents a space from being generated in the interface. As such, it is possible to prevent (i) $H_2$, $H_2O$, and the like from accumulating in the interface and (ii) bubbles from occurring. Furthermore, the arrangement allows an increase in the pressure acting between the transferred member 6 and the glass substrate 2. This can actively remove $H_2$, $H_2O$, and the like from the interface. On this account, it is possible to prevent (i) $H_2$, $H_2O$, and the like from accumulating in the interface and (ii) bubbles from occurring.

A method for applying a pressure on the composite during the thermal treatment is not limited to any specific one. For example, a pressure can be applied with use of a pressing method. More specifically, the thermal treatment can be carried out, for example, in a device filled with an inert gas so that an atmospheric pressure is above one atmosphere. This allows a pressure above one atmosphere to be applied on the composite. Alternatively, a pressing member, for example, can be used to apply a pressure from at least one of the transferred member 6 and the glass substrate 2 to the other. This allows a pressure to be applied to the composite. An arrangement of the pressing member is not limited to any specific one, provided that the pressing member can apply a pressure to at least one of the transferred member 6 and the glass substrate 2.

The method of the present embodiment for producing a semiconductor device preferably includes the step of, prior to the thermal treatment, keeping the temperature of the composite lower than a temperature at which a blister occurs in the composite (see S21 in FIG. 2). The temperature at which a blister occurs in the composite is normally 100° C.-150° C. lower than the separation temperature. More specifically, the temperature at which a blister occurs differs depending on a condition under which a peeled-layer forming substance is implanted into the transferred member 6 to be used. For example, the temperature at which the blister occurs is approximately 420° C. (e.g., 350° C.), in a case where hydrogen ions are implanted into the transferred member 6 under the condition that an acceleration energy is 150 keV and an implanting rate is 6 E 16 $cm^{-2}$.

A device and method for keeping the temperature of the composite lower than the temperature at which the blister occurs in the composite are not limited to any specific ones. A known device and method can be used as appropriate. For example, a vacuum oven can be used. However, the device is not limited to this.

The method like above allows a semiconductor device as illustrated in (e) of FIG. 1 to be produced. According to the semiconductor device produced by the method, it is possible to reduce a bubble density to not more than five bubbles/$cm^2$. The bubbles are each not smaller than 10 μm in diameter. The bubble density and the diameters of the bubbles can be measured with a measuring instrument such as a microscope.

The semiconductor device thus produced undergoes additional processes as necessary, and can be then used in a desired apparatus (see S23 in FIG. 2). Such additional processes are not limited to any specific ones. Desired processes can be additionally carried out as appropriate according to need. Examples of such processes encompass: a process of producing another device (peripheral device) to which the semiconductor device is to be connected; a process of connecting the semiconductor device to another device; and a process of producing a TFT. The additional processes are, however, not limited to these.

Figure 3A:
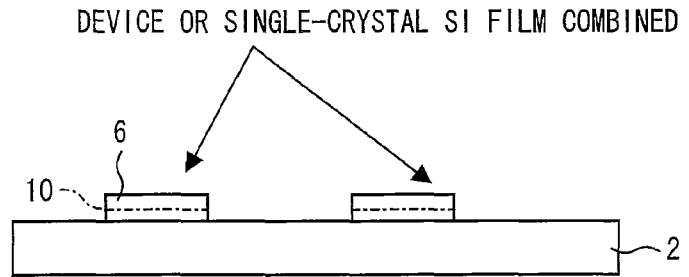
FIG. 3(a) is a cross-sectional view illustrating a semiconductor device in which a plurality of silicon thin films are formed on a glass substrate.
Figure 3B:
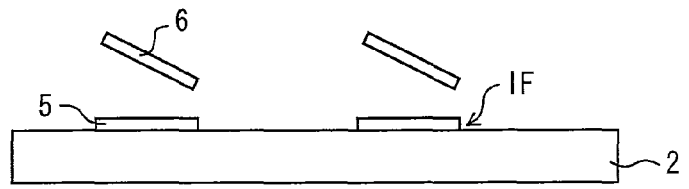
FIG. 3(b) is a cross-sectional view illustrating the semiconductor device in which the plurality of silicon thin films are formed on the glass substrate.
Figure 3C:
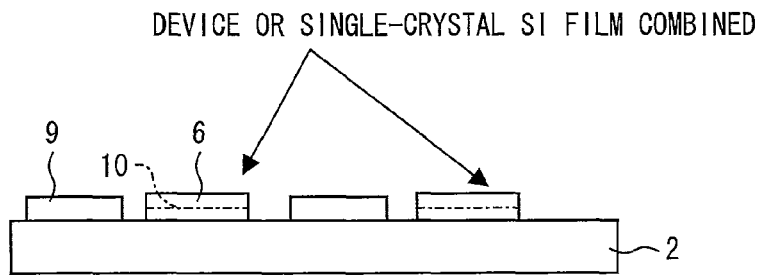
FIG. 3(c) is a cross-sectional view illustrating a semiconductor device in which silicon thin films and poly-Si TFTs are formed on a glass substrate.
Figure 3D:
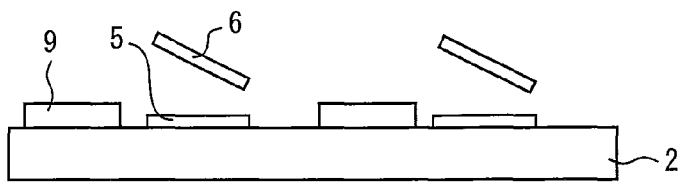
FIG. 3(d) is a cross-sectional view illustrating the semiconductor device in which the silicon thin films and the poly-Si TFTs are formed on the glass substrate.

As illustrated in FIGS. 3(a) through 3(d), the method of the present embodiment for producing a semiconductor device can produce (i) a device in which a plurality of silicon thin films 5 are provided on a glass substrate 2 (see FIG. 3(b)) and (ii) a device in which silicon thin films 5 and poly-Si TFTs 9 are provided so as to coexist on a glass substrate 2 (see FIG. 3(d)).

The process of producing a silicon thin film 5 has been described, and therefore its description is omitted here. To produce a device in which silicon thin films 5 and poly-Si TFTs 9 are provided so as to coexist on a glass substrate 2, as illustrated in FIG. 3(c), the poly-Si TFTs 9 simply needs to be provided on the glass substrate 2 after the transferred members 6 each including a peeled layer 10 are combined with the glass substrate 2 so as to form a composite. Note that the method for forming the poly-Si TFTs 9 is not limited to any specific one. A known method can be used as appropriate.

The composite in which the poly-Si TFTs 9 and the transferred members 6 are provided on the glass substrate 2 is then subjected to the foregoing thermal treatment. This enables easy production of a device in which the silicon thin films 5 and the poly-Si TFTs 9 are provided so as to coexist on the glass substrate 2 (see FIG. 3(d)).

To complete the present invention, the inventors of the present invention (i) carried out thermal desorption spectroscopy to determine a range of a heating temperature needed to remove, e.g., hydrogen in the film and (ii) checked whether it is possible to prevent bubbles from occurring by rapidly lowering the temperature of the composite after the peeling.

Figure 4:
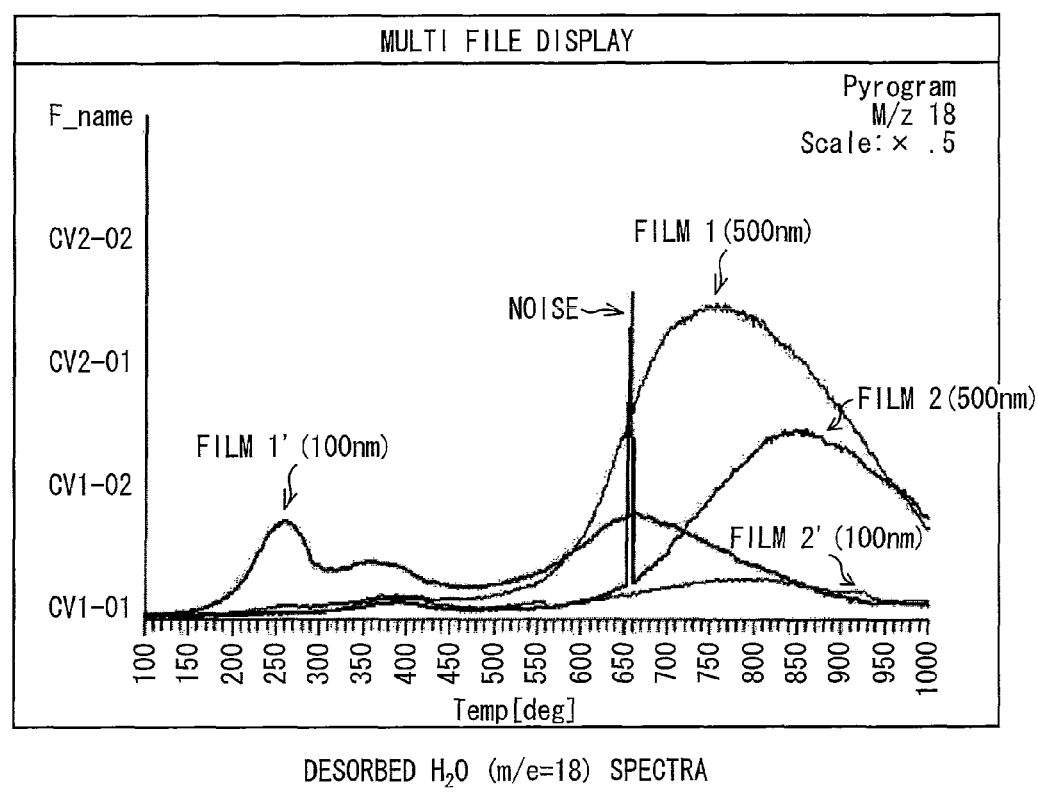
FIG. 4 is a graph showing desorption, measured by TDS, of $H_2O$ in films in an example.
Figure 5:
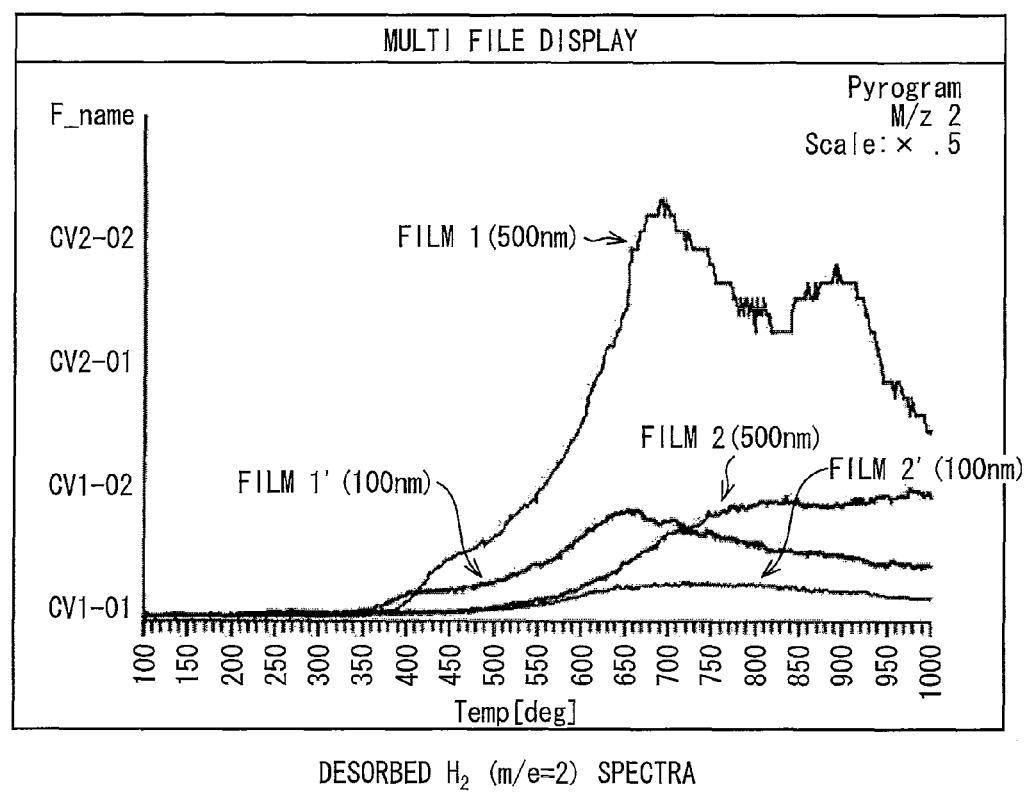
FIG. 5 is a graph showing desorption, measured by TDS, of $H_2$ in films in the example.

FIGS. 4 and 5 illustrate desorption of $H_2$ and $H_2O$ in films, the desorption having been measured by thermal desorption spectroscopy (TDS). $SiO_2$ films (oxide films) formed under respective different conditions were used as the films (films 1', 1, 2', and 2). As shown in FIGS. 4 and 5, each of the films had a thickness of either 100 nm or 500 nm. It was made clear that although the desorption depends on a film type, vacuum-heating of a film at a temperature of not lower than 300° C., and preferably of not lower than 400° C., can achieve the advantage of the present invention.

A bubble appears to form as follows. Namely, in response to the heat treatment, $H_2$, $H_2O$, and the like, which exist in the interface or in the film, move toward and concentrate in a region in which the binding energy is weak. This will cause the bubbles to be formed. It appears that, if the heat treatment is continued even after the peeled layer is peeled, during such a heat treatment, $H_2$, $H_2O$, and the like (i) move toward and concentrate in the interface region in which the binding energy is weak, and then (ii) expand in volume, so that bubbles are formed. In view of the circumstances, it appears to be possible to prevent such bubbles from occurring by ending the heat treatment immediately after the peeled layer is peeled. Actually, the inventors of the present invention conducted a study on whether or not the number of generated bubbles increased in a case where the heat treatment was continued after the peeled layer was peeled. Specifically, the inventors of the present invention carried out the heat treatment with respect to the glass substrate at 580° C., carried out an additional heat treatment with respect to the glass substrate at 600° C., and then counted with a microscope the number of bubbles caused. The result is shown in FIG. 6.

Figure 6:
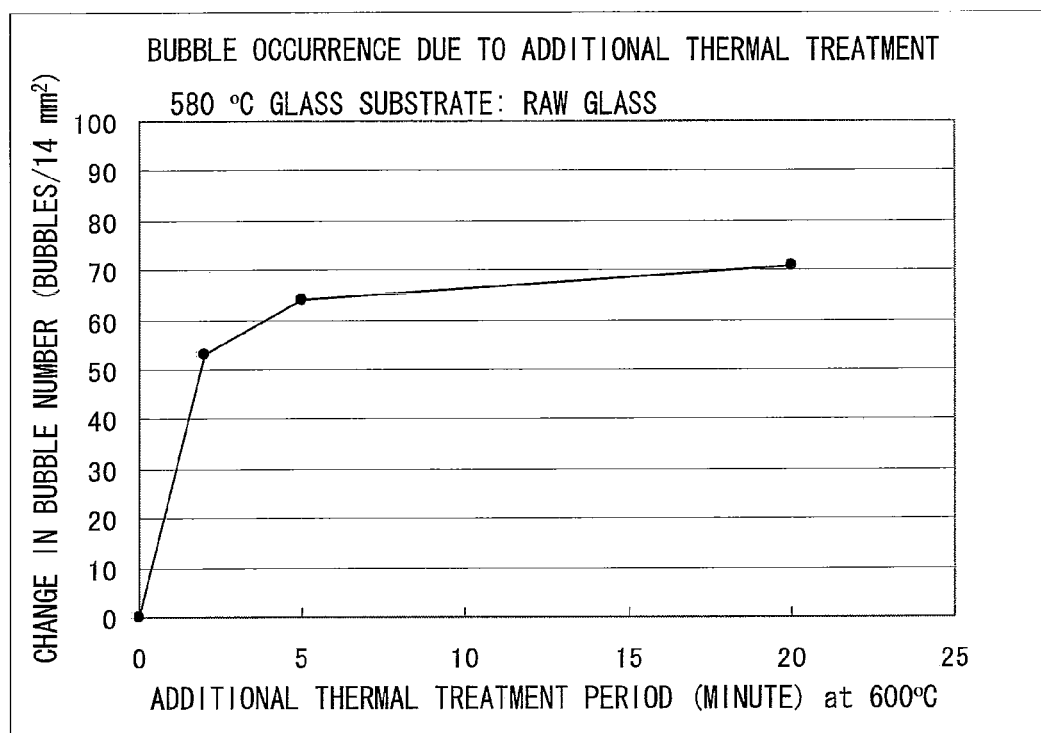
FIG. 6 is a graph showing how bubbles occurred in a case where an additional heat treatment was carried out after a peel in the example.
Figure 7:
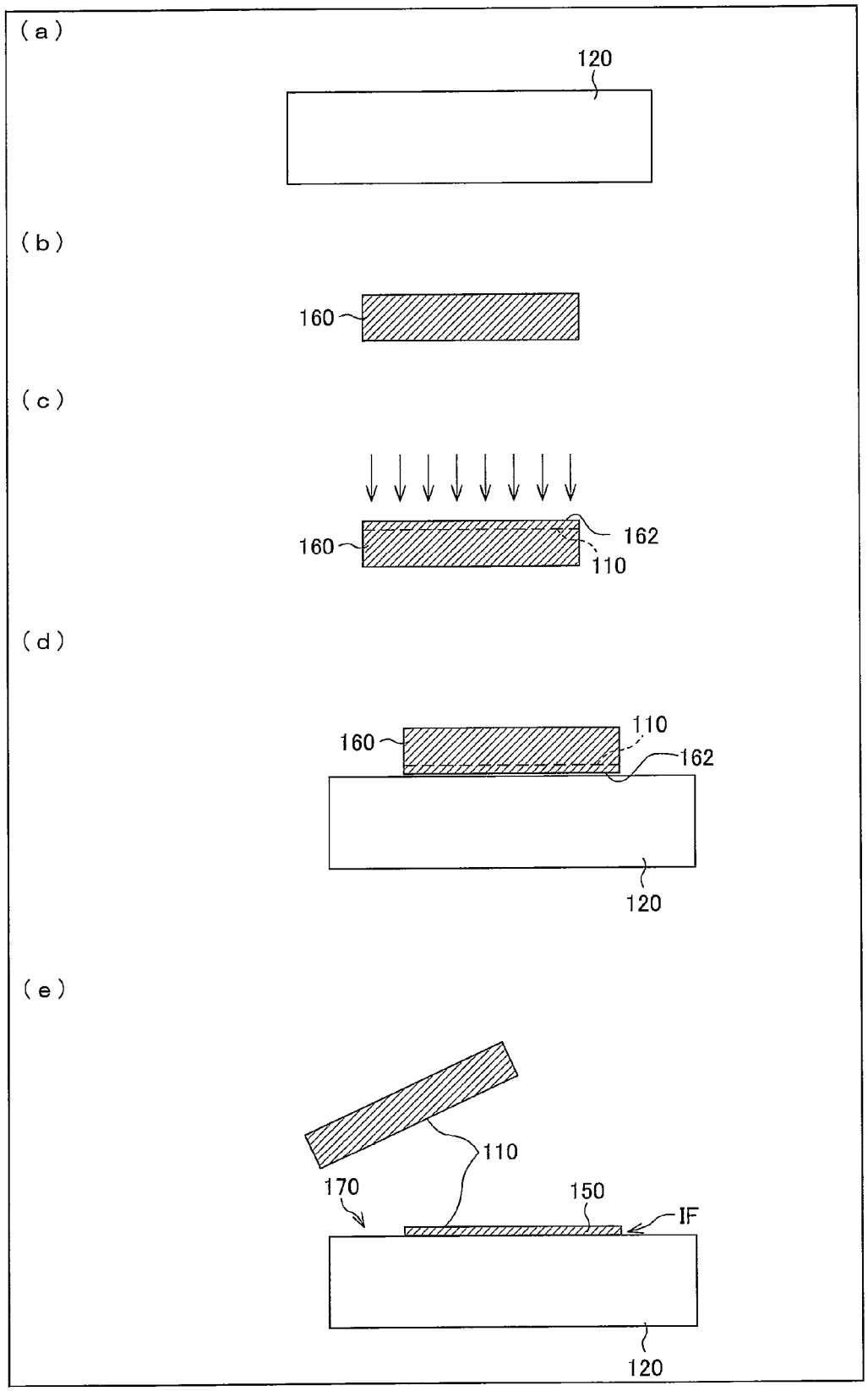
FIG. 7 is a cross-sectional view illustrating how a conventional transfer substrate is produced through steps.
Figure 8:
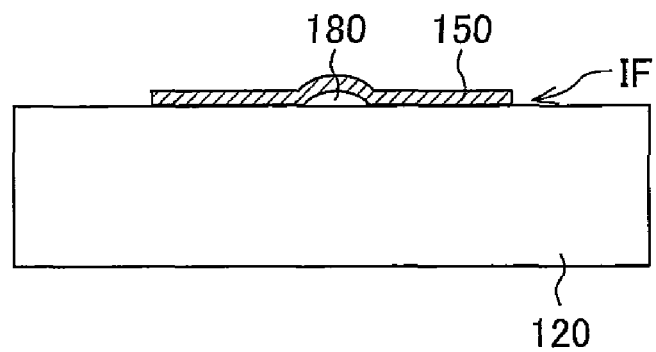
FIG. 8 is a cross-sectional view illustrating a transfer substrate produced by a conventional technique and having a bubble caused in an interface.

FIG. 6 clearly shows that such an additional heat treatment caused bubbles to form. It appears that the reason why the bubbles are caused by such an additional heat treatment is that the part of the transferred member, which has pressed against the region of the interface in which region the binding energy is weak, is peeled from the composite, and then $H_2$, $H_2O$ and the like concentrate and form the bubbles.

When a process of ending the thermal treatment is employed immediately after the peeling, and when it is possible to maintain the pressing against the region of the interface in which region the binding energy is weak even after the part of the transferred member is separated, then it becomes possible to improve bond strength by pressing against a transferred region in which the binding energy is weak. This is achievable by carrying out the thermal treatment for the separation while a pressure above one atmosphere is being applied on the composite.

Also, it is possible to cause $H_2$, $H_2O$, and the like which exist in the interface to escape so that the binding energy increases, (i) by spending more time for the step of raising a temperature to a temperature at which the peeling occurs or (ii) by carrying out a treatment with respect to the composite for a predetermined time period at a temperature of lower than the blister generating temperature (temperature at which the peeled-layer forming substance starts to expand). This ultimately allows prevention of bubbles from occurring.

EXAMPLES

Example 1

A device in which a peeled layer was formed by implanting hydrogen into a single-crystal Si substrate was prepared. Next, a $SiO_2$ film was formed on a surface of the device. The $SiO_2$ film was planarized by CMP. Note that the hydrogen was implanted under the condition that implanting energy is 150 keV and an implanting rate is 6 E 16 $cm^{-2}$.

The device, having the $SiO_2$ film on its surface, was heated in vacuum at 350° C. for 2 hours so as to cause gases such as $H_2$ and $H_2O$ to escape from the film. The device was cut, by a method such as the dicing, so as to have a desired size, and is then subjected to a surface treatment (SC1 treatment) so as to have hydrophilicity.

A similar surface treatment was carried out with respect to a glass substrate, onto which the device was to be transferred. After that, the transferring was carried out by directly combining the device with a surface of the glass substrate.

A part of the device was peeled under the condition that a temperature-raising rate was 150° C./min and a heating temperature was within a range from 520° C. to 650° C. After the part of the device was peeled, (i) the heat treatment was ended immediately and (ii) the part thus peeled was removed from a composite of the device and the glass substrate. Note that this removal was achieved by causing the part of the device to free-fall from the composite of the device and the glass substrate. Note also that the heating temperature at which the part of the device was peeled was determined in advance with use of a dummy.

The device prepared by the above method had a bubble density of not more than five bubbles/$cm^2$.

Example 2

A peeled layer was formed by thermally oxidizing a single-crystal Si substrate, and then by implanting hydrogen into the single-crystal Si substrate. A surface treatment (SC1 treatment) was carried out with respect to the single-crystal Si substrate and a glass substrate onto which the single-crystal Si substrate was to be transferred. Then, the single-crystal Si substrate was transferred onto the glass substrate by combining the substrates with each other. Note that the glass substrate can be cut so as to have a desired size.

The device prepared by the above method had a bubble density of not more than five bubbles/$cm^2$.

Example 3

A device in which a peeled layer was formed by implanting H or hydrogen into a single-crystal Si substrate was prepared. Next, a $SiO_2$ film was formed on a surface of the device. The $SiO_2$ film was planarized by CMP. Note that the hydrogen was implanted under the condition that implanting energy is 130 keV and an implanting rate is 4 E 16 $cm^{-2}$.

The device was cut by the dicing so as to have a desired size. Then, a surface treatment was carried out with respect to a glass substrate onto which the device was to be transferred. After that, the transferring was carried out by combining the device with the glass substrate.

A part of the device was peeled under the condition that a temperature-raising rate was 5° C./min and a heating temperature was within a range from 550° C. to 700° C. The heat treatment increases a binding energy in the interface. After the part of the device was peeled, (i) the heat treatment was ended immediately and (ii) the part thus peeled was removed from a composite of the device and the glass substrate. Note that the removal of the part of the device was achieved by causing the part of the device to free-fall from the composite of the device and the glass substrate.

The device prepared by the above method had a bubble density of not more than five bubbles/$cm^2$.

Example 4

A device in which a peeled layer was formed by implanting hydrogen into a single-crystal Si substrate was prepared. Next, a $SiO_2$ film was formed on a surface of the device. The $SiO_2$ film was planarized by CMP. Note that the hydrogen was implanted under the condition that implanting energy is 120 keV and an implanting rate is 4 E 16 $cm^{-2}$.

The device was cut by the dicing so as to have a desired size. Then, a surface treatment was carried out with respect to a glass substrate onto which the device was to be transferred. After that, the transferring was carried out by combining the device with the glass substrate.

The following temperature raising rates were used so that a part of the device was peeled: First, the device was heated, in accordance with a temperature raising rate of 10° C./min, to a temperature (300° C.) of lower than a temperature at which a blister (expansion of the separatory substance) occurs. Such a temperature (300° C.) was maintained for one (1) hour. This increased a binding energy in the interface. The device was further heated, in accordance with a temperature raising rate of 10° C./min, to a peel temperature (from 550° C. to 700° C.). After a part of the device was peeled, (i) the heating was ended immediately and (ii) the peeled part of the device was removed from the composite of the device and the glass substrate.

The device prepared by the above method had a bubble density of not more than five bubbles/cm$^2$.

Example 5

A device in which a peeled layer was produced by implanting hydrogen into a single-crystal Si substrate was prepared. Next, a SiO$_2$ film was formed on a surface of the device. The SiO$_2$ film was planarized by CMP.

The device was cut by the dicing so as to have a desired size. Then, a surface treatment was carried out with respect to a glass substrate onto which the device was to be transferred. After that, the transferring was carried out by combining the device with the glass substrate.

After the transfer, a composite including the device and the glass substrate was vacuum-heated under N$_2$ atmosphere at 200° C. The composite was constantly heated at 200° C. for 5 hours. This increased a binding energy in the interface. Next, the vacuum state was ended. Further, the device was further heated, in accordance with a temperature raising rate of 2° C./min, to a peel temperature (from 500° C. to 700° C.). After a part of the device was peeled, (i) the heating was ended immediately and (ii) the peeled part of the device was removed from the composite of the device and the glass substrate.

The device prepared by the above method had a bubble density of not more than five bubbles/cm$^2$.

Example 6

A device in which a peeled layer was produced by implanting hydrogen into a single-crystal Si substrate was prepared. Next, a SiO$_2$ film was formed on a surface of the device. The SiO$_2$ film was planarized by CMP. Note that the hydrogen was implanted under the condition that implanting energy is 160 keV and an implanting rate is 5 E 16 cm$^{-2}$.

The device was cut by the dicing so as to have a desired size. Then, a surface treatment was carried out with respect to a glass substrate onto which the device was to be transferred. After that, the transferring was carried out by combining the device with the glass substrate.

A composite including the device and the glass substrate was subjected to a thermal treatment under a pressure of two atmospheres. This thermal treatment was performed as follows: The temperature was raised at a temperature-raising rate of 50° C./min to the separation temperature (500° C. to 650° C.); Then, the temperature was lowered at 120° C./min. After the part of the device was peeled, (i) the heat treatment was ended immediately and (ii) the part thus peeled was removed from a composite of the device and the glass substrate.

The device prepared by the above method had a bubble density of not more than five bubbles/cm$^2$.

Example 7

A device in which a peeled layer was produced by implanting helium into a single-crystal Si substrate was prepared. Next, a SiO$_2$ film was formed on a surface of the device. The SiO$_2$ film was planarized by CMP. Note that the helium was implanted under the condition that implanting energy is 120 keV and an implanting rate is 3 E 17 cm$^{-2}$.

A hydrophilization treatment (SC1 treatment) was performed both on a surface of the device and on a surface of a glass substrate, onto which the device was to be transferred. The device was then combined with the glass substrate so as to be transferred on the glass substrate.

The following temperature raising rates were used so that a part of the device was peeled: First, the device was heated, in accordance with a temperature raising rate of 5° C./min, to a temperature (300° C.) of lower than a temperature at which a blister (expansion of the separatory substance) occurs. The device was further heated, in accordance with a temperature raising rate of 100° C./min, to a peel temperature (from 450° C. to 700° C.). After a part of the device was peeled, (i) the heating was ended immediately and (ii) the peeled part of the device was removed from the composite of the device and the glass substrate.

The device prepared by the above method had a bubble density of not more than five bubbles/cm$^2$.

Example 8

A device in which a peeled layer was produced by implanting hydrogen into a single-crystal Si substrate was prepared. Next, a SiO$_2$ film was formed on a surface of the device. The SiO$_2$ film was planarized by CMP.

A poly-Si TFT was formed on a glass substrate so that a region onto which a device was to be transferred was secured on the glass substrate.

A hydrophilization treatment (SC1 treatment) was performed both on a surface of the device and on a surface of the glass substrate, onto which the device was to be transferred. The device was then combined with the glass substrate so as to be transferred on the glass substrate.

The following temperature raising rates were used so that a part of the device was peeled: First, the device was heated, in accordance with a temperature raising rate of 2° C./min, to a temperature (300° C.) of lower than a temperature at which a blister (expansion of the separatory substance) occurs. The device was further heated, in accordance with a temperature raising rate of 120° C./min, to a peel temperature (from 500° C. to 700° C.). After a part of the device was peeled, (i) the heating was ended immediately and (ii) the peeled part of the device was removed from the composite of the device and the glass substrate.

The device prepared by the above method had a bubble density of not more than five bubbles/cm$^2$.

Example 9

A single-crystal Si substrate was thermally oxidized so that a thermal oxide film having a thickness of 100 nm was formed. Then, hydrogen was implanted into the single-crystal Si substrate. This formed a peeled layer.

The single-crystal Si substrate was cut for a desired size.

A hydrophilization treatment (SC1 treatment) was performed both on a surface of the single-crystal Si substrate cut as above and on a surface of the glass substrate, onto which the single-crystal Si substrate was to be transferred. The single-crystal Si substrate was then combined with the glass substrate so as to be transferred on the glass substrate.

A composite including the single-crystal Si substrate and the glass substrate was heated with a laser. This caused a part of the single-crystal Si substrate to be peeled from the composite along the peeled layer. After the part of the single-crystal Si substrate was peeled, (i) the heat treatment was ended immediately and (ii) the part thus peeled was removed from a composite of the single-crystal Si substrate and the glass substrate. Note that the removal of the part of the single-crystal Si substrate was achieved by causing the part of the single-crystal Si substrate to free-fall from the composite of the device and the glass substrate.

The device prepared by the above method had a bubble density of not more than five bubbles/cm$^2$.

The present invention is not limited to the arrangements above, but may be altered by a skilled person within the scope of the claims. Any embodiment or example based on a proper combination of the technical means disclosed in the embodiment and the different examples is also encompassed in the technical scope of the present invention.

INDUSTRIAL APPLICABILITY

As described above, a method of the present invention for producing a semiconductor device includes the steps of: (a) forming a peeled layer in a transferred member by implanting a peeled-layer forming substrate into the transferred member; (b) forming a planar surface in the transferred member by planarizing a surface of the transferred member; (c) forming a composite including the transferred member and a glass substrate by directly combining the transferred member via the planar surface with a surface of the glass substrate; and (d) peeling a part of the transferred member from the composite along the peeled layer serving as an interface by heat-treating the composite.

As described above, a method of the present invention for producing a semiconductor device includes the steps of: (a) forming a peeled layer in a transferred member by implanting a peeled-layer forming substrate into the transferred member; (b) forming a planar surface in the transferred member by planarizing a surface of the transferred member; (c) forming a composite including the transferred member and a glass substrate by combining the transferred member via the planar surface with the glass substrate; and (d) peeling a part of the transferred member from the composite along the peeled layer serving as an interface by heat-treating the composite, wherein the step (d) includes, after the composite is heat-treated, rapidly lowering a temperature of the composite from which the part of the transferred member has been peeled.

As described above, a semiconductor device of the present invention is a semiconductor device produced by a method of the present invention and arranged such that the semiconductor device has a bubble density of not more than five bubbles/cm$^2$.

This prevents, e.g., H$_2$ and H$_2$O from accumulating in the interface between the transferred member and the glass substrate, thereby preventing bubbles from occurring due to the above accumulation.

The semiconductor device of the present invention includes a semiconductor layer closely combined with an insulating substrate. Thus, the semiconductor device is suitably applicable to, e.g., an active matrix liquid crystal display device, which requires high performance and high yield.

The invention claimed is:

1. A method for producing a semiconductor device, comprising the steps of:
   (a) forming a peeled layer in a transferred member by implanting a peeled-layer forming substrate into the transferred member;
   (b) forming a planar surface of the transferred member by planarizing a surface of the transferred member;
   (c) forming a composite including the transferred member and a glass substrate by directly combining the transferred member, via the planar surface, with a surface of the glass substrate; and
   (d) peeling a part of the transferred member from the composite by carrying out a heat treatment with respect to the composite, the peeled layer serving as an interface.

2. The method according to claim 1, wherein the glass substrate is unbaked.

3. A method for producing a semiconductor device, the method comprising the steps of:
   (a) forming a peeled layer in a transferred member by implanting a peeled-layer forming substrate into the transferred member;
   (b) forming a planar surface of the transferred member by planarizing a surface of the transferred member;
   (c) forming a composite including the transferred member and a glass substrate by combining the transferred member, via the planar surface, with the glass substrate; and
   (d) peeling a part of the transferred member from the composite by carrying out a heat treatment with respect to the composite, the peeled layer serving as an interface,
   wherein the step (d) includes the step,
   (e) rapidly lowering a temperature of the composite from which the part of the transferred member has been peeled, after the heat treatment.

4. The method according to claim 3, wherein, in the step (e), the temperature of the composite is lowered at a temperature-lowering rate of not smaller than 2° C/sec.

5. The method according to claim 3, wherein, in the step (e), the temperature of the composite is lowered at a temperature-lowering rate of not smaller than 5° C/sec.

6. The method according to claim 3, wherein, in the step (e), the temperature of the composite is lowered at a temperature-lowering rate of not smaller than 10° C/sec.

7. The method according to claim 1, wherein, in the step (b), the planar surface is formed by forming an insulating film on the transferred member, and then planarizing a surface of the insulating film.

8. The method according to claim 7, wherein the insulating film is a silicon oxide film.

9. The method according to claim 1, wherein, in the step (b), the surface is planarized by chemical mechanical polishing.

10. The method according to claim 1, wherein, in the step (c), the transferred member is subjected to a heat treatment in vacuum at a temperature of not higher than 350° C., before the transferred member is combined with the glass substrate.

11. The method according to claim 1, wherein the composite is kept at a temperature of lower than 350° C., before the heat treatment is carried out with respect to the composite.

12. The method according to claim 1, wherein, in the step (d), the composite is heated to a temperature which falls within a range from 400° C. to 700° C.

13. The method according to claim 1, wherein, in the step (d), the heat treatment is carried out with respect to the composite for a time period of not longer than 60 seconds.

14. The method according to claim 1, wherein, in the step (d), the heat treatment is carried out with respect to the composite for a time period of not longer than 30 seconds.

15. The method according to claim 1, wherein, in the step (d), the heat treatment is carried out with respect to the composite for a time period of not longer than 10 seconds.

16. The method according to claim 13, wherein, in the step (d), the composite is heated to a temperature of not higher than (a separation temperature +20° C.).

17. The method according to claim 1,
   wherein:
   the heat treatment includes a temperature-raising step,
   the temperature-raising step, including:
   a first temperature-raising step; and a second temperature-raising step by which the first temperature-raising step is followed,
a temperature-raising rate is lower in the first temperature-raising step than in the second temperature-raising step.

18. The method according to claim 1,
wherein:
the heat treatment includes a temperature-raising step,
the temperature-raising step including:
    a first temperature-raising step; and
    a second temperature-raising step by which the first temperature-raising step is followed; and
an initial temperature, in the second temperature-raising step, falls within a range from (a separation temperature −150° C.) to the separation temperature.

19. The method according to claim 1, wherein the heat treatment is carried out with respect to the composite under a pressure above one atmosphere.

20. The method according to claim 19, wherein the pressure is applied on the composite with use of a pressing method.

21. The method according to claim 1, wherein the peeled-layer forming substrate is hydrogen or a noble gas.

22. The method according to claim 1, wherein the transferred member is a single-crystal chip, a semiconductor chip, or a semiconductor device.

23. A semiconductor device produced by a method recited in claim 1, wherein a bubble density is not more than five bubbles/cm$^2$.

24. The semiconductor device according to claim 23, wherein the bubbles each have a diameter of not smaller than 10 μm.

25. The semiconductor device according to claim 23, comprising a gate oxide film serving as a thermal oxide film.

26. The method according claim 3, wherein, in the step (b), the planar surface is formed by forming an insulating film on the transferred member, and then planarizing a surface of the insulating film.

27. The method according to claim 3, wherein, in the step (b), the surface is planarized by chemical mechanical polishing.

28. The method according to claim 3, wherein, in the step (c), the transferred member is subjected to a heat treatment in vacuum at a temperature of not higher than 350° C., before the transferred member is combined with the glass substrate.

29. The method according to claim 3, wherein the composite is kept at a temperature of lower than 350° C., before the heat treatment is carried out with respect to the composite.

30. The method according to claim 3, wherein, in the step (d), the composite is heated to a temperature which falls within a range from 400° C. to 700° C.

31. The method according to claim 3, wherein, in the step (d), the heat treatment is carried out with respect to the composite for a time period of not longer than 60 seconds.

32. The method according to claim 31, wherein, in the step (d), the composite is heated to a temperature of not higher than (a separation temperature +20° C.).

33. The method according to claim 3,
wherein:
the heat treatment includes a temperature-raising step,
the temperature-raising step, including:
    a first temperature-raising step; and
    a second temperature-raising step by which the first temperature-raising step is followed,
a temperature-raising rate is lower in the first temperature-raising step than in the second temperature-raising step.

34. The method according to claim 3,
wherein:
the heat treatment includes a temperature-raising step,
the temperature-raising step including:
    a first temperature-raising step; and
    a second temperature-raising step by which the first temperature-raising step is followed; and
an initial temperature, in the second temperature-raising step, falls within a range from (a separation temperature −150° C.) to the separation temperature.

35. The method according to claim 3, wherein the heat treatment is carried out with respect to the composite under a pressure above one atmosphere.

36. The method according to claim 3, wherein the peeled-layer forming substrate is hydrogen or a noble gas.

37. The method according to claim 3, wherein the transferred member is a single-crystal chip, a semiconductor chip, or a semiconductor device.

38. A semiconductor device produced by a method recited in claim 3, wherein a bubble density is not more than five bubbles/cm$^2$.

39. The semiconductor device according to claim 38, wherein the bubbles each have a diameter of not smaller than 10 μm.

40. The semiconductor device according to claim 38, comprising a gate oxide film serving as a thermal oxide film.

* * * * *